(12) United States Patent
Kawai

(10) Patent No.: US 8,760,041 B2
(45) Date of Patent: Jun. 24, 2014

(54) RESONATOR ELEMENT WITH MASS FORMED ON VIBRATING ARM

(75) Inventor: Hiroki Kawai, Chino (JP)

(73) Assignee: Seiko Epson Corporation (JP)

( * ) Notice: Subject to any disclaimer, the term of this patent is extended or adjusted under 35 U.S.C. 154(b) by 428 days.

(21) Appl. No.: 12/976,163

(22) Filed: Dec. 22, 2010

(65) Prior Publication Data
US 2011/0156826 A1 Jun. 30, 2011

(30) Foreign Application Priority Data

Dec. 29, 2009 (JP) ................................. 2009-299045
Aug. 11, 2010 (JP) ................................. 2010-180100

(51) Int. Cl.
*H01L 41/08* (2006.01)
*H03H 9/21* (2006.01)

(52) U.S. Cl.
CPC ...................................... *H03H 9/21* (2013.01)
USPC ........................................................ 310/370

(58) Field of Classification Search
CPC ........................................................ H03H 9/21
USPC ........................................................ 310/370
See application file for complete search history.

(56) References Cited

U.S. PATENT DOCUMENTS

| | | | | |
|---|---|---|---|---|
| 3,969,641 | A | * | 7/1976 | Oguchi et al. ................. 310/348 |
| 4,377,765 | A | * | 3/1983 | Kogure et al. ................. 310/312 |
| 4,498,025 | A | * | 2/1985 | Takahashi ..................... 310/312 |
| 4,771,202 | A | * | 9/1988 | Takahashi ..................... 310/312 |
| 5,918,354 | A | | 7/1999 | Ikegami et al. |
| 6,545,392 | B2 | | 4/2003 | Kawauchi et al. |
| 6,768,247 | B2 | | 7/2004 | Kitamura et al. |
| 6,864,619 | B2 | | 3/2005 | Aigner et al. |
| 6,924,582 | B2 | | 8/2005 | Shimizu et al. |
| 7,337,667 | B2 | * | 3/2008 | Ohuchi et al. ............. 73/504.16 |
| 7,368,861 | B2 | * | 5/2008 | Tanaya ........................... 310/370 |
| 7,397,172 | B2 | * | 7/2008 | Kikushima .................... 310/370 |

(Continued)

FOREIGN PATENT DOCUMENTS

| | | |
|---|---|---|
| JP | 54-065496 | 5/1979 |
| JP | 63-262911 | 10/1988 |

(Continued)

OTHER PUBLICATIONS

Extended European Search Report for Application No. 10 19 6457 mailed Sep. 6, 2012 (6 pages).

(Continued)

*Primary Examiner* — J. San Martin
(74) *Attorney, Agent, or Firm* — Harness, Dickey & Pierce, P.L.C.

(57) ABSTRACT

A resonator element includes: a base portion provided on a plane including a first axis and a second axis orthogonal to the first axis; a vibrating arm extending from the base portion in the first axis direction; and a first mass portion for adjusting a resonance frequency of the vibrating arm, wherein the vibrating arm performs flexural vibration in a direction perpendicular to the plane and has a first surface which contracts or expands with the flexural vibration and a second surface which expands when the first surface contracts and contracts when the first surface expands, and wherein the first mass portion is provided on at least one of the first and second surfaces and approximately at the center of the length of the vibrating arm from a base-side end to a tip end thereof.

12 Claims, 7 Drawing Sheets

(56) References Cited

U.S. PATENT DOCUMENTS

| | | | |
|---|---|---|---|
| 7,441,459 B2 * | 10/2008 | Ohuchi et al. | 73/504.16 |
| 7,592,741 B2 | 9/2009 | Tanaya et al. | |
| 7,631,412 B2 | 12/2009 | Barber et al. | |
| 7,759,848 B2 * | 7/2010 | Hirasawa | 310/370 |
| 7,764,145 B2 * | 7/2010 | Iwai | 333/200 |
| 7,948,157 B2 * | 5/2011 | Iwatate et al. | 310/370 |
| 8,098,002 B2 * | 1/2012 | Baborowski et al. | 310/370 |
| 8,201,450 B2 * | 6/2012 | Ohuchi et al. | 73/504.12 |
| 8,314,666 B2 * | 11/2012 | Huang et al. | 333/186 |
| 8,390,389 B2 * | 3/2013 | Kawai | 331/156 |
| 8,446,079 B2 * | 5/2013 | Fang et al. | 310/370 |
| 2008/0129415 A1 | 6/2008 | Iwai | |
| 2009/0015106 A1 * | 1/2009 | Tanaya | 310/344 |
| 2010/0013360 A1 * | 1/2010 | Baborowski et al. | 310/370 |
| 2010/0156237 A1 | 6/2010 | Ichikawa et al. | |
| 2011/0156827 A1 * | 6/2011 | Kawai | 331/116 R |
| 2011/0227450 A1 * | 9/2011 | Yamazaki | 310/318 |

FOREIGN PATENT DOCUMENTS

| | | | |
|---|---|---|---|
| JP | 02-233009 | | 9/1990 |
| JP | 07-212161 | | 8/1995 |
| JP | 2001-196882 | A | 7/2001 |
| JP | 2001-196891 | | 7/2001 |
| JP | 2002-164759 | A | 6/2002 |
| JP | 2003-133885 | | 5/2003 |
| JP | 2003-318685 | | 11/2003 |
| JP | 2003318685 | A * | 11/2003 |
| JP | 2006-262456 | A | 9/2006 |
| JP | 2009-5022 | | 1/2009 |
| JP | 2009290778 | A * | 12/2009 |

OTHER PUBLICATIONS

Extended European Search Report for Application No. 10 19 6456 mailed Sep. 6, 2012 (6 pages).

* cited by examiner

RESONATOR ELEMENT WITH MASS FORMED ON VIBRATING ARM

BACKGROUND

1. Technical Field

The present invention relates to a resonator element, a resonator, an oscillator, an electronic device, and a frequency adjustment method.

2. Related Art

In a resonator having a vibrating arm, a resonator element is known in which a vibrating arm vibrates in the thickness direction of the vibrating arm (such a mode of vibration is an out-of-plane mode) rather than vibrating in an in-plane mode. This resonator element generally has an odd number of vibrating arms. When the resonator element has three or more vibrating arms, adjacent vibrating arms perform walk-mode vibration in which they repeatedly vibrate alternately in opposing directions.

Adjustment of the frequency (resonance frequency) of a tuning-fork type resonator that vibrates in an in-plane mode is performed by providing a weight on a plane in the vibration direction of the tip end of a vibrating arm and irradiating the weight with laser light or the like to remove a part of the weight. This method performs frequency adjustment by removing a part of the weight to decrease the weight of the vibrating arm, thus sequentially increasing the frequency (see JP-A-2003-318685, for example).

In contrast, the frequency (resonance frequency) of a resonator that vibrates in an out-of-plane mode is proportional to the thickness in the vibration direction of a vibrating arm and is inversely proportional to the square of the length of the vibrating arm. Therefore, adjustment of the frequency is performed by adding a weight to the side surfaces of a vibrating arm rather than adding the weight to the surfaces defining the thickness of the vibrating arm and irradiating the weight with laser light to remove a part of the weight on the side surfaces.

When a resonator vibrating in an out-of-plane mode is miniaturized, since the length of the vibrating arm decreases, it is necessary to make the vibrating arm thin in order to obtain the same frequency.

However, it is difficult to add a weight on the side surfaces of a thin vibrating arm as in the related art. Moreover, even when the weight can be added to the side surfaces of the vibrating arm, it is very difficult to irradiate the side surfaces with laser light to remove a part of the weight. It is desirable that frequency adjustment of a resonator that vibrates in the out-of-plane mode is performed easily and with high accuracy.

SUMMARY

An advantage of some aspects of the invention is to solve at least a part of the above-described problems and the invention can be implemented as the following forms or application examples.

APPLICATION EXAMPLE 1

According to this application example of the invention, there is provided a resonator element including: a base portion provided on a plane including a first axis and a second axis orthogonal to the first axis; a vibrating arm extending from the base portion in the first axis direction; and a first mass portion for adjusting a resonance frequency of the vibrating arm, in which the vibrating arm performs flexural vibration in a direction perpendicular to the plane and has a first surface which contracts or expands with the flexural vibration and a second surface which expands when the first surface contracts and contracts when the first surface expands, and in which the first mass portion is provided on at least one of the first and second surfaces and approximately at the center of the length of the vibrating arm from a base-side end to a tip end thereof.

According to this configuration, the first mass portion of the resonator element is formed approximately at the center of the length of the vibrating arm. At the center of the vibrating arm, the boundary of the weight effect where the frequency increases/decreases with an increase/decrease of the mass and the thickness effect where the frequency increases/decreases with the thickness of the vibrating arm is present. For example, at a portion where the weight effect is dominant when a film or the like is removed, the frequency is adjusted toward the positive side so as to increase. On the other hand, at a portion where the thickness effect is dominant when the film or the like is removed, the frequency is adjusted towards the negative side so as to decrease. Conversely, at a portion where the weight effect is dominant when a film is added, the frequency is adjusted toward the negative side so as to decrease. On the other hand, at a portion where the thickness effect is dominant when the film is added, the frequency is adjusted towards the positive side so as to increase.

As described above, it is possible to easily perform high-accuracy frequency adjustment in which the frequency of the resonator element can be adjusted in the positive (higher) and negative (lower) directions in the intermediate portion of the vibrating arm, and the variation in the frequencies with the frequency adjustment is small.

APPLICATION EXAMPLE 2

In the resonator element of the application example, the first mass portion may be formed from a gold film.

According to this configuration, since the first mass portion is a gold film, it is easy to remove a part of the gold film, and favorable frequency adjustment can be performed.

APPLICATION EXAMPLE 3

In the resonator element of the application example, slits may be provided on the first mass portion.

According to this configuration, slits are formed on the first mass portion. That is, since the metal film is sparsely formed on the surface, it is possible to remove a very small amount when the frequency adjustment of the resonator element is performed by removing the metal film. Thus, it is possible to perform high-accuracy frequency adjustment in which the variation in the frequencies is small.

APPLICATION EXAMPLE 4

In the resonator element of the application example, the first mass portion may be provided in at least a portion of the range of 0.30 L or more and 0.65 L or lower from a base-side end with respect to the entire length L of the vibrating arm.

According to this configuration, in the first mass portion provided at a position ranging from 0.30 L to 0.65 L from the base-side end, by removing the gold film, it is possible to perform the frequency adjustment in which the variation in the frequencies is ±1000 ppm. In this way, the frequency of the resonator element can be adjusted in the positive (higher) and negative (lower) directions. Therefore, in the first mass portion, it is possible to perform the frequency adjustment with a wide adjustment range, and high-accuracy frequency adjustment of the resonator element is possible.

APPLICATION EXAMPLE 5

In the resonator element of the application example, the first mass portion may be provided in at least a portion of the range of 0.42 L or more and 0.57 L or lower from a base-side end with respect to an entire length L of the vibrating arm.

According to this configuration, in the first mass portion provided at a position ranging from 0.42 L to 0.57 L from the base-side end, by removing the gold film, it is possible to perform the frequency adjustment in which the variation in the frequencies is ±200 ppm. In this way, the frequency of the resonator element can be adjusted in the positive (higher) and negative (lower) directions. Therefore, in the first mass portion, it is possible to perform the frequency adjustment with a narrow adjustment range, and high-accuracy frequency adjustment of the resonator element is possible.

APPLICATION EXAMPLE 6

The resonator element of the application example may further include a second mass portion for adjusting the resonance frequency on at least one of the first and second surfaces of the tip end of the vibrating arm.

According to this configuration, rough tuning is performed with the second mass portion for rough tuning which is provided at the tip end of the vibrating arm, and fine tuning can be performed with the first mass portion disposed approximately at the center. Therefore, it is possible to shorten the processing time of the frequency adjustment in a resonator element in which the amount of adjustment is large.

APPLICATION EXAMPLE 7

According to this application example of the invention, there is provided a frequency adjustment method including: preparing a resonator element including a base portion provided on a plane including a first axis and a second axis orthogonal to the first axis, a vibrating arm extending from the base portion in the first axis direction, and a first mass portion for adjusting a resonance frequency of the vibrating arm, the vibrating arm performing flexural vibration in a direction perpendicular to the plane and having a first surface which contracts or expands with the flexural vibration and a second surface which expands when the first surface contracts and contracts when the first surface expands, and the first mass portion being provided on at least one of the first and second surfaces and approximately at the center of the length of the vibrating arm from a base-side end to a tip end thereof; and adjusting the resonance frequency of the vibrating arm by changing the mass of the first mass portion.

According to this frequency adjustment method, the resonance frequency of the resonator element is finely tuned by changing the mass of the first mass portion which is formed approximately at the center in the longitudinal direction of the vibrating arm.

At the center of the vibrating arm, the boundary of the weight effect where the frequency increases/decreases with an increase/decrease of the mass and the thickness effect where the frequency increases/decreases with the thickness of the vibrating arm is present. For example, at a portion where the weight effect is dominant when a film or the like is removed, the frequency is adjusted toward the positive side so as to increase. On the other hand, at a portion where the thickness effect is dominant when the film or the like is removed, the frequency is adjusted towards the negative side so as to decrease. Conversely, at a portion where the weight effect is dominant when a film is added, the frequency is adjusted toward the negative side so as to decrease. On the other hand, at a portion where the thickness effect is dominant when the film is added, the frequency is adjusted towards the positive side so as to increase.

As described above, it is possible to easily perform high-accuracy frequency adjustment in which the frequency of the resonator element can be adjusted in the positive (higher) and negative (lower) directions in the intermediate portion of the vibrating arm, and the variation in the frequencies with the frequency adjustment is small.

APPLICATION EXAMPLE 8

In the frequency adjustment method of the application example, the frequency of the resonator element may be set so as to be lower than a target frequency before the fine-adjusting of the frequency, and the mass may be decreased from the first mass portion formed on the tip end side of approximately the center of the length in the first axis direction of the vibrating arm.

According to this frequency adjustment method, the mass is decreased from a portion of the first mass portion formed close to the tip end side with respect to the center of the length in the first axis direction of the vibrating arm. By so doing, the frequency can be changed greatly at the initial adjustment stage, and the frequency adjustment can be performed efficiently.

APPLICATION EXAMPLE 9

In the frequency adjustment method of the application example, the first mass portion may be formed from a gold film, and the mass of the first mass portion may be decreased by removing the gold film using a laser.

According to this frequency adjustment method, the gold film is irradiated with laser light so as to remove a part of the gold film, whereby the mass of the first mass portion is decreased. The gold film can be easily removed by a laser, and the frequency adjustment can be performed efficiently.

APPLICATION EXAMPLE 10

According to this application example of the invention, there is provided a resonator including the resonator element according to the above aspect and a package accommodating the resonator element.

According to this configuration, since the resonator includes the resonator element which enables easy and high-accuracy frequency adjustment, it is possible to provide a resonator having excellent frequency accuracy.

APPLICATION EXAMPLE 11

According to this application example of the invention, there is provided an oscillator including the resonator element according to the above aspect and a circuit element connected to the resonator element.

According to this configuration, since the oscillator includes the resonator element which enables easy and high-accuracy frequency adjustment, it is possible to provide an oscillator having excellent frequency accuracy.

APPLICATION EXAMPLE 12

According to this application example of the invention, there is provided an electronic device using the resonator element according to the above aspect.

According to this configuration, it is possible to provide an electronic device exhibiting the advantages mentioned in any one of the application examples 1 to 6.

BRIEF DESCRIPTION OF THE DRAWINGS

FIGS. 3A to 3C show a configuration of a resonator element according to a first embodiment, in which

FIGS. 7A and 7B show a configuration of a resonator according to a second embodiment, in which

FIGS. 8A and 8B show a configuration of an oscillator according to a third embodiment, in which

DESCRIPTION OF EXEMPLARY EMBODIMENTS

Prior to a description of embodiments, the relationship between a mass portion of a resonator element that vibrates in an out-of-plane mode and the frequency thereof will be described in detail.

Figure 1:
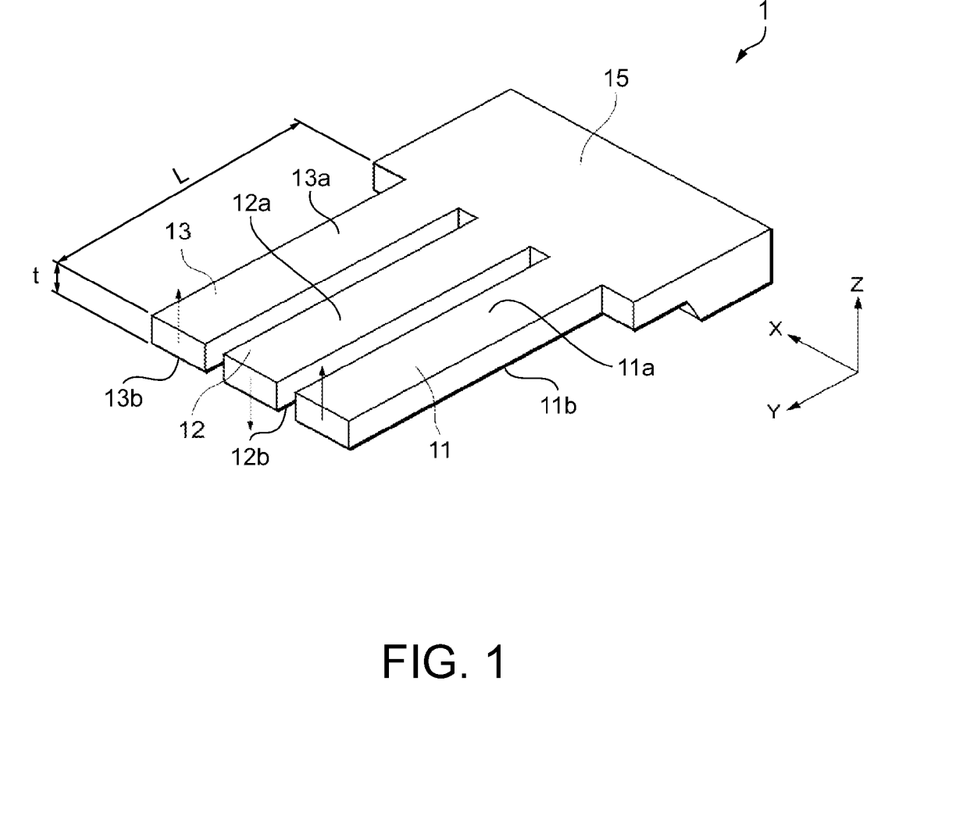
FIG. 1 is a schematic perspective view illustrating an example of a resonator element that vibrates in an out-of-plane mode.
Figure 2:
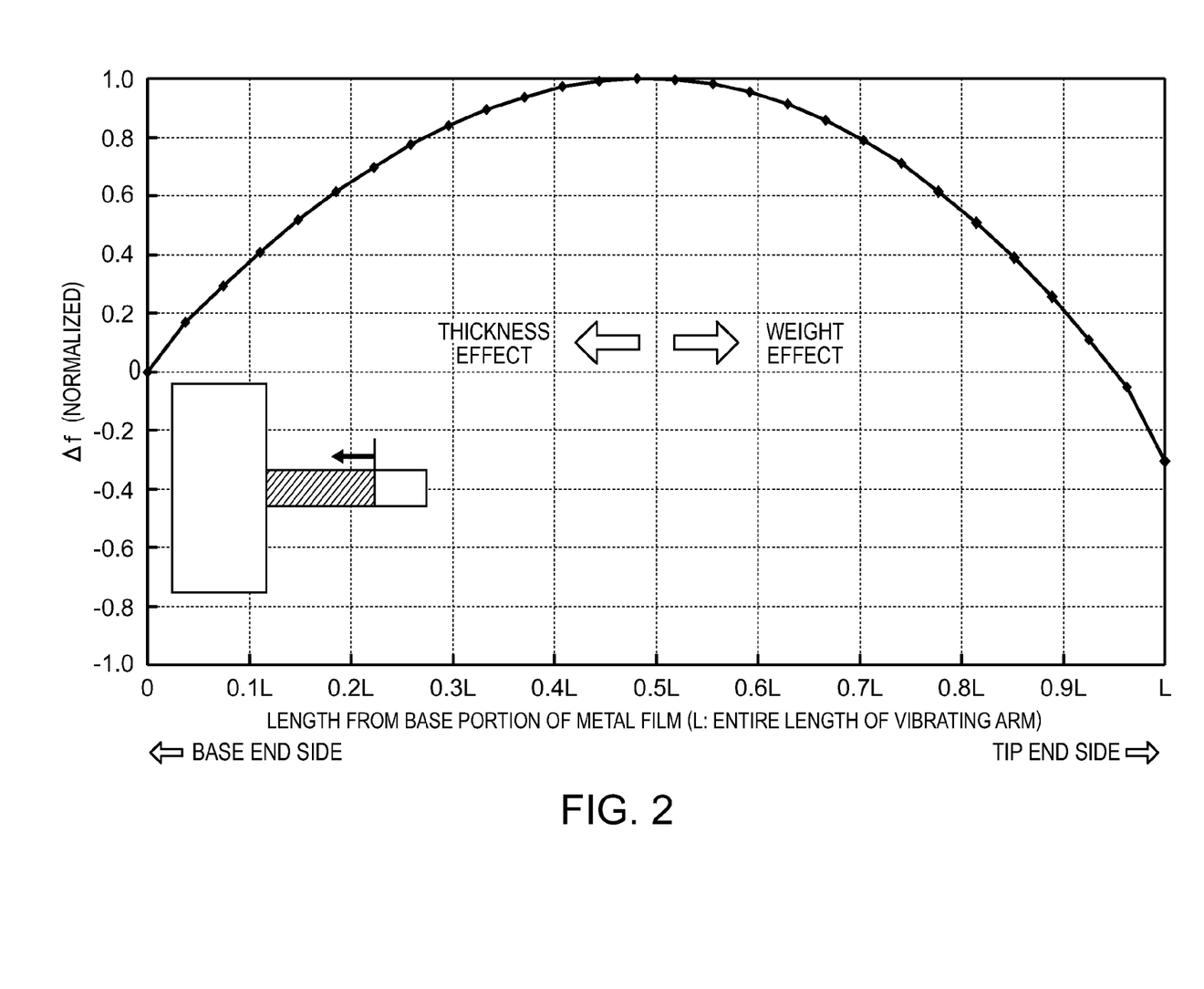
FIG. 2 is a graph showing the relationship between the formation position of a metal film formed on a vibrating arm and the frequency.

FIG. 1 is a schematic perspective view illustrating an example of a resonator element that vibrates in an out-of-plane mode. FIG. 2 is a graph showing the relationship between the formation position of a metal film formed on a vibrating arm and the frequency.

As shown in FIG. 1, a resonator element 1 that vibrates in an out-of-plane mode includes a base portion 15 and three vibrating arms 11, 12, and 13 extending in parallel from the base portion 15.

In the following description, when an extension direction of the vibrating arms 11, 12, and 13 is the Y direction (first axis), and a direction perpendicular to the Y direction and along which the vibrating arms 11, 12, and 13 are arranged is the X direction (second axis), a direction orthogonal to the X and Y directions is defined as the Z direction.

The out-of-plane mode of vibration is a vibration mode in which the tip end of the vibrating arm vibrates in the Z direction, namely a direction orthogonal to the XY plane, and adjacent vibrating arms repeatedly vibrate in opposing directions. Such a mode of vibration is generally called an out-of-plane mode of vibration since the vibrating arms vibrate out of the XY plane on which they are formed.

Therefore, when the vibrating arms 11 and 13 vibrate in the +Z direction, and the vibrating arm 12 vibrates in the −Z direction, the opposing surfaces (specifically, first surfaces 11a, 12a, and 13a and second surfaces 11b, 12b, and 13b) of the vibrating arms 11, 12, and 13 formed on the XY plane expand or contract differently. That is, the first surfaces 11a and 13a contract, and the second surfaces 11b and 13b expand. On the other hand, the first surface 12a expands, and the second surface 12b contracts. The contraction and expansion relationship is reversed from the above when the vibrating arms 11 and 13 vibrate in the −Z direction and the vibrating arm 12 vibrates in the +Z direction. The number of vibrating arms is not limited to three, but may be one or five.

In a resonator element that vibrates in such an out-of-plane mode, when f is the resonance frequency of the resonator element, L is the entire length of the vibrating arm, and t is the thickness in the vibration direction of the vibrating arm, a relation of $f \propto (t/L^2)$ is satisfied.

That is, the resonance frequency f of the resonator element that vibrates in the out-of-plane mode is proportional to the thickness t in the vibration direction of the vibrating arm and is inversely proportional to the square of the entire length L of the vibrating arm.

In regard to the basic properties of such a resonator element 1, similarly to a resonator element that vibrates in the in-plane mode of the tuning-fork type, when performing frequency adjustment by adding or removing a film on the first or second surface of the vibrating arm disposed in the XY plane, it is necessary to consider changes in the thickness as well as just a weight effect. For this reason, it was considered to be difficult to perform the frequency adjustment by adding or removing a film on the first or second surface of the vibrating arm.

The present inventor has made an observation using a resonator element that vibrates in the out-of-plane mode and has one vibrating arm on a base portion thereof as a model and performed a simulation on the changes in frequency when a metal film was formed on one surface of the vibrating arm disposed in the XY plane and removed from the tip end side of the vibrating arm.

FIG. 2 is a graph showing the simulation results, in which the vertical axis represents a normalized frequency variation Δf, and the horizontal axis represents the ratio of the length from the base-side end of the metal film serving as a frequency adjustment film to the entire length L of the vibrating arm. The Δf on the vertical axis is a value given by $\Delta f = (f - f0)/f$ where f0 is the frequency when no metal film (frequency adjustment film) was formed on the vibrating arm, and f is the frequency when the metal film (frequency adjustment film) was formed. Further, the value Δf is normalized as Δf(normalized)=Δf/(maximum Δf) so that the maximum of Δf becomes 1. The graph shows simulation data obtained when a gold (Au) film was formed as the metal film.

According to the graph of FIG. 2, when the metal film formed on the vibrating arm is removed from the tip end side thereof, the frequency sequentially increases, and the frequency change becomes zero at approximately the central portion of the vibrating arm. When the metal film is further removed towards the base portion, the frequency sequentially decreases. Moreover, the variation of the frequency decreases towards the central portion.

With the vicinity of the center in the longitudinal direction of the vibrating arm as a boundary, the weight effect is dominant on the tip end side of the vibrating arm, and the frequency changes in an increasing direction with the removal of the metal film. Moreover, the thickness effect is dominant on the base end side of the vibrating arm from the vicinity of the center in the longitudinal direction of the vibrating arm, and the frequency changes in a decreasing direction with the removal of the metal film.

In this way, the present inventor has discovered the fact that a boundary at which the direction of the change in the frequency changes is present approximately at the center in the longitudinal direction of the vibrating arm. Based on these findings, the present inventor has created this invention.

Hereinafter, embodiments embodying the invention will be described with reference to the drawings. In the respective drawings used in the following description, the ratios of the dimensions of each element are changed appropriately in order to depict each element in a recognizable size.

First Embodiment

Figure 3A:
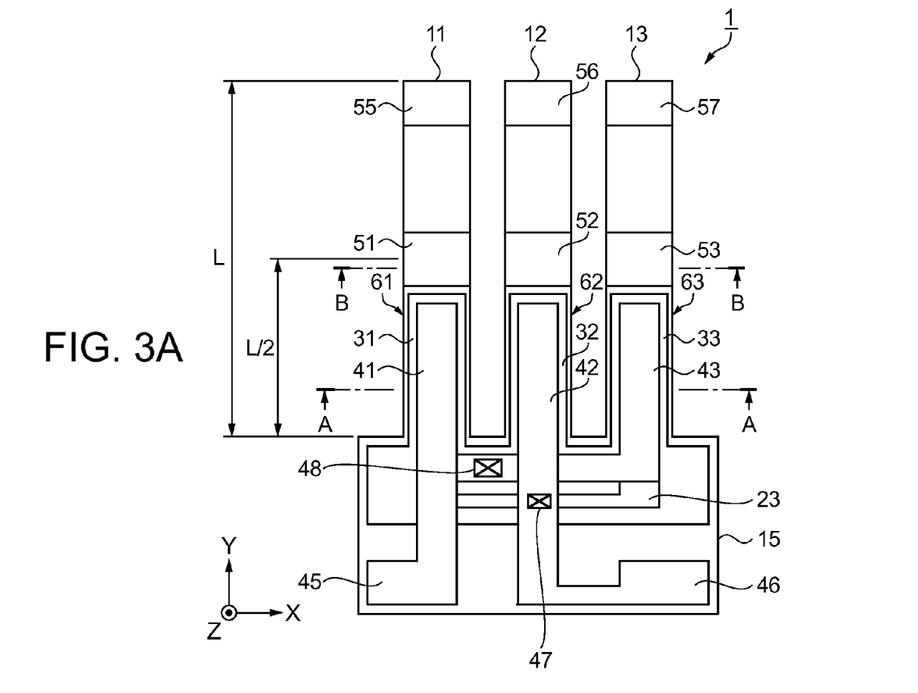
FIG. 3A is a schematic top view.
Figure 3B:
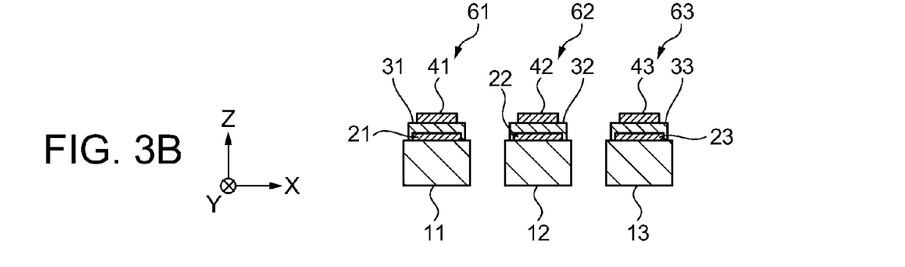
FIG. 3B is a schematic sectional view taken along the line A-A in FIG. 3A.
Figure 3C:
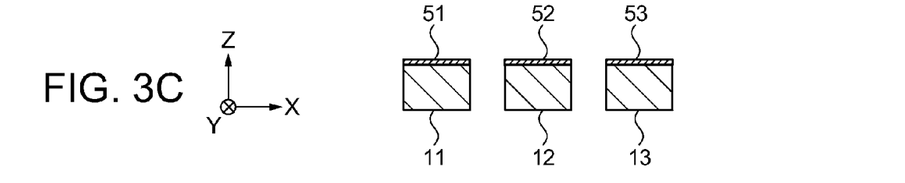
FIG. 3C is a schematic sectional view taken along the line B-B in FIG. 3A.

FIGS. 3A to 3C show a configuration of a resonator element according to a first embodiment, in which FIG. 3A is a schematic top view, FIG. 3B is a schematic sectional view taken along the line A-A in FIG. 3A, and FIG. 3C is a schematic sectional view taken along the line B-B in FIG. 3A.

The resonator element 1 has a shape such that the thickness direction thereof corresponds to the Z direction when it is expanded on the XY plane of an orthogonal coordinate system. The resonator element 1 includes three vibrating arms 11, 12, and 13, and the vibrating arms 11, 12, and 13 are arranged in the X direction (second axis direction), and each vibrating arm extends in parallel in the Y direction (first axis direction). The vibrating arms 11, 12, and 13 are connected to the base portion 15, thus constructing the resonator element 1 in which the respective vibrating arms 11, 12, and 13 have a cantilever structure. In that case, it can be said that the base portion 15 is formed on a plane (XY plane) including the Y direction (first axis) and the X direction (second axis) orthogonal to the Y direction (first axis direction).

Piezoelectric elements 61, 62, and 63 are formed at positions of the vibrating arms 11, 12, and 13 close to the base portion 15, respectively.

As shown in FIG. 3B, the piezoelectric element 61 formed on the vibrating arm 11 is provided on one side of the opposing surfaces (the surface perpendicular to the Z direction) defining the thickness of the vibrating arm 11. The piezoelectric element 61 is formed by a laminate made up of a lower electrode 21, a piezoelectric film 31, and an upper electrode 41. Although not shown in the drawing, an insulating film may be formed between the piezoelectric film 31 and the upper electrode 41.

In this way, the lower electrode 21 and the upper electrode 41 face each other with the piezoelectric film 31 interposed therebetween, whereby the piezoelectric element 61 is formed. Thus, the piezoelectric film 31 is able to contract or expand when a positive or negative voltage is applied between the electrodes. Moreover, the vibrating arm 11 can be displaced in the Z direction when the piezoelectric film 31 contracts or expands.

Similarly, the piezoelectric elements 62 and 63 formed on the vibrating arms 12 and 13, respectively are formed as laminates which are formed on one side of the opposing surfaces defining the thickness of the vibrating arm 11 and which are respectively made up of lower electrodes 22 and 23, piezoelectric films 32 and 33, and upper electrodes 42 and 43.

Moreover, lower electrodes 21, 22, and 23 and the upper electrodes 41, 42, and 43 are extracted to the base portion 15 of the resonator element 1 and connected to mount electrodes 45 and 46 of which electrical conduction is realized by being fixed to a base of a container or the like. Moreover, a connection portion 47 is provided so as to connect the lower electrodes 21 and 23 and the upper electrode 42 together, and a connection portion 48 is provided so as to connect the lower electrode 22 and the upper electrodes 41 and 43 together. As a result, the polarity of the piezoelectric elements 61 and 63 is reversed from the polarity of the piezoelectric element 62.

Due to such a configuration, the vibrating arm 12 vibrates in the −Z direction when the vibrating arms 11 and 13 vibrate in the +Z direction.

As shown in FIG. 3C, a first mass portion 51 is provided on the same surface as the surface where the piezoelectric element 61 of the vibrating arm 11 is formed. The first mass portion 51 is formed from a gold (Au) film. Moreover, in order to improve the adhesion strength of the gold film to the base material thereof, a base layer such as a chromium (Cr) film may be formed on the base. In addition, a metal film such as an aluminum (Al) film may be used instead of the gold film.

The first mass portion 51 is provided so as to adjust the frequency of the vibrating arm 11, and the frequency of the vibrating arm 11 is adjusted by removing a part of the gold film. The first mass portion 51 is formed approximately at the center of the vibrating arm 11.

Next, the position of the first mass portion 51 disposed on the vibrating arm 11 will be described in detail.

Figure 4:
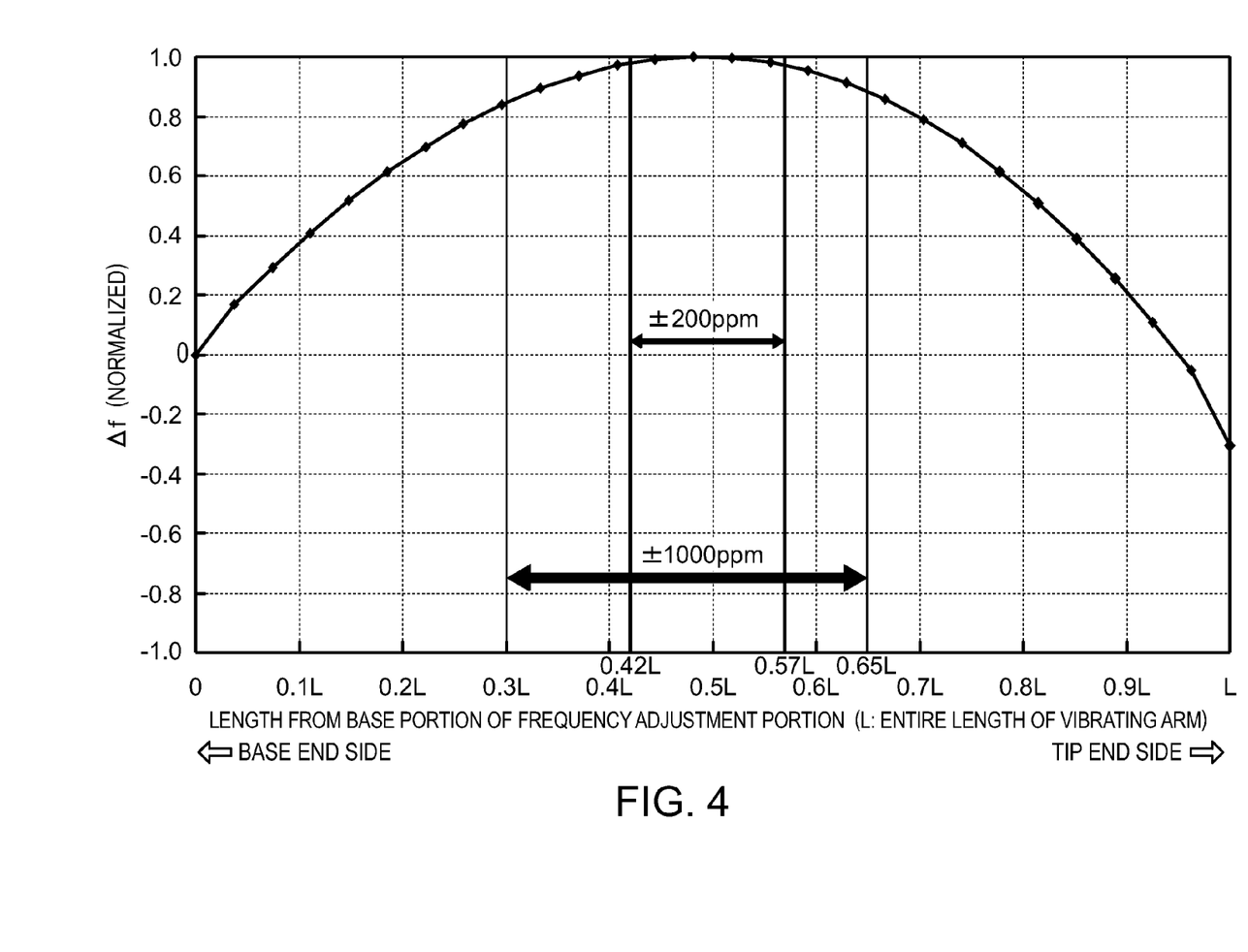
FIG. 4 is a graph showing the relationship between a frequency adjustment range (adjustment amount) and the position of the mass portion relative to the length of the vibrating arm in the first embodiment.

FIG. 4 is a graph showing the relationship between a frequency adjustment range (adjustment amount) and the position of the first mass portion from the base portion relative to the entire length L of the vibrating arm. This graph is the same as the graph described in FIG. 2 and shows the data obtained when a gold film was formed as the first mass portion.

According to the graph, when the gold film formed on the vibrating arm is removed from the tip end side thereof, the frequency sequentially increases, and the frequency change becomes zero at approximately the center (0.5 L) of the vibrating arm. When the gold film is further removed towards the base portion, the frequency sequentially decreases. Moreover, the variation of the frequency decreases towards the center (0.5 L). In this way, with the center in the longitudinal direction of the vibrating arm as a boundary, the weight effect is dominant on the tip end side of the vibrating arm, and the frequency changes in an increasing direction with the removal of the metal film. Moreover, the thickness effect is dominant on the base end side of the vibrating arm approximately from the center in the longitudinal direction of the vibrating arm, and the frequency changes in a decreasing direction with the removal of the metal film. By using this phenomenon, it is possible to perform the frequency adjustment in which the variation in the frequencies is ±1000 ppm, for example, by providing the first mass portion 51 in at least a portion of the range of 0.30 L or more and 0.65 L or lower from the base portion 15 with respect to the entire length L of the vibrating arm 11 and removing the gold film present in the range of 0.30 L or more and 0.65 L or lower. Moreover, it is possible to perform the frequency adjustment in which the variation in the frequencies is ±200 ppm by providing the first mass portion 51 in at least a portion of the range of 0.42 L or more and 0.57 L or lower from the base portion 15 and removing the gold film present in the range of 0.42 L or more and 0.57 L or lower.

In the present embodiment, the first mass portion 51 is provided in the range of 0.42 L or more and 0.57 L or lower from the base portion 15.

First mass portions 52 and 53 having the same configuration as that of the vibrating arm 11 are also provided to the vibrating arms 12 and 13.

Furthermore, as shown in FIG. 3A, second mass portions 55, 56, and 57 for rough tuning are provided at the tip ends of the vibrating arms 11, 12, and 13, respectively, on the same surface as the surface where the first mass portions 51, 52, and 53 are formed. The second mass portions 55, 56, and 57 for rough tuning are formed from a gold film similarly to the first mass portions 51, 52, and 53. A metal film may be arranged between the second mass portions 55, 56, and 57 for rough tuning and the first mass portions 51, 52, and 53 so that the two mass portions are connected together.

As shown in FIG. 4, the second mass portions 55, 56, and 57 for rough tuning formed at the tip ends of the vibrating arms can be used as frequency adjustment films for rough tuning of a resonator element in which the amount of adjustment is large and of which the variation of the frequencies with the removal of a metal film is large. Therefore, by using the tip ends of the vibrating arms 11, 12, and 13 as the mass portions for rough tuning and using approximately the centers as the mass portions for fine tuning, it is possible to effectively perform the frequency adjustment of the resonator element 1 in a short period of time.

When the amount of adjustment of the resonator element 1 is small, the second mass portions 55, 56, and 57 for rough tuning are not essential, and the frequency adjustment is possible simply with the first mass portions 51, 52, and 53. For example, by providing the first mass portions 51, 52, and 53 in the range of 0.30 L or more and 0.65 L or lower from the base portion 15, it is possible to perform the frequency adjustment in which the variation of the frequencies is ±1000 ppm.

As described above, in the present embodiment, having discovered the fact that the boundary at which the direction of the change in the frequency changes is present approximately at the center in the longitudinal direction of the vibrating arm of a resonator element that vibrates in the out-of-plane mode, by providing the first mass portion for finely tuning the frequency of the vibrating arm approximately at the center of the entire length L of the vibrating arm, it is possible to perform high-accuracy fine tuning of the frequency.

As for the lower electrode and the upper electrode, a metal material such as gold (Au), aluminum (Al), or titanium (Ti) may be used. Moreover, in order to improve the adhesion strength of the lower electrode and upper electrode to a base, a chromium (Cr) film may be provided between each electrode and the base. As for the piezoelectric film, a material such as ZnO, AlN, PZT, LiNbO$_3$, or KNbO$_3$ may be used, and particularly, ZnO and AlN are more preferable since superior properties can be obtained. As the insulating film, SiO$_2$, SiN, and the like are used.

The resonator element 1 is formed using a base material made from quartz, silicon, or the like. When quartz is used as the base material of the resonator element 1, an X-cut plate, an AT-cut plate, a Z-cut plate, or the like can be used.

In addition, in the above-described embodiment, although the first mass portions 51, 52, and 53 and the second mass portions 55, 56, and 57 for rough tuning are formed on the first surface side of the vibrating arm, the invention is not limited to this. The first and second mass portions may be formed on the second surface side of the vibrating arm and may be formed on both the first and second surface sides of the vibrating arm.

Next, an example of a frequency adjustment method in the resonator element having such a configuration will be described.

Figure 5A:
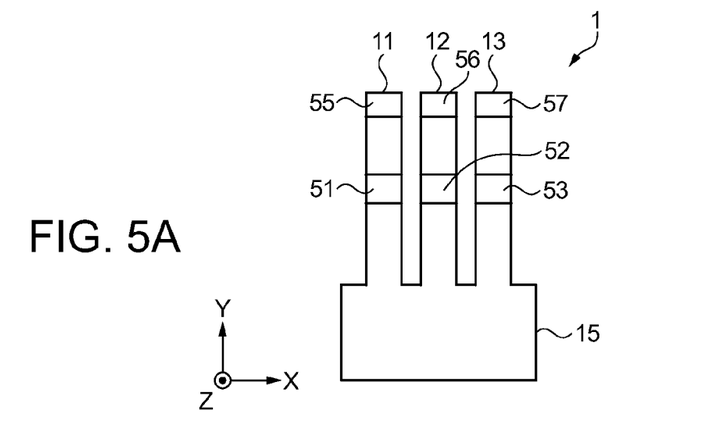
FIGS. 5A to 5C are schematic views illustrating the order of frequency adjustment in the resonator element of the first embodiment.
Figure 5B:
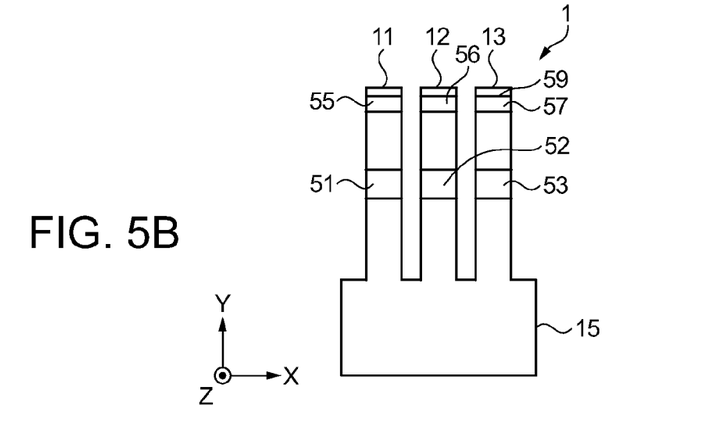
Figure 5C:
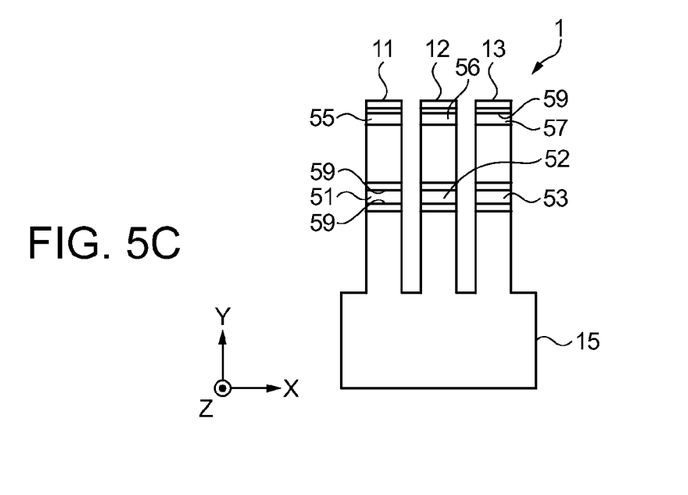

FIGS. 5A to 5C are schematic views illustrating the order of frequency adjustment in a resonator element. In the drawing, the piezoelectric elements, wirings, and the like are not illustrated.

As shown in FIG. 5A, the second mass portion for rough tuning and the first mass portion for fine tuning are formed on each of the vibrating arms 11, 12, and 13 of the resonator element 1. The second mass portions 55, 56, and 57 for rough tuning are disposed on the tip end sides of the vibrating arms 11, 12, and 13, and the first mass portions 51, 52, and 53 for fine tuning are disposed approximately at the central portions of the vibrating arms 11, 12, and 13.

Before the adjustment, the frequency of the resonator element 1 is set to be lower than a target frequency.

First, as shown in FIG. 5B, the metal films of the second mass portions 55, 56, and 57 for rough tuning of the vibrating arms 11, 12, and 13 are irradiated with laser light so as to remove a part of each metal film.

The laser light is continuously irradiated in the X direction so as to cross the vibrating arms 11, 12, and 13. In this way, the metal films are removed in a linear form, and a laser processed line 59 is formed on the second mass portions 55, 56, and 57 for rough tuning. The irradiation of laser light is repeated until the frequency of the resonator element 1 falls within a desired frequency range. In this way, the frequency of the resonator element 1 is adjusted so as to increase by the removal of the metal film. Moreover, the frequency after the rough tuning is set to be lower than a target frequency.

Subsequently, when rough tuning of the resonator element 1 is completed, as shown in FIG. 5C, the metal films of the first mass portions 51, 52, and 53 for fine tuning of the vibrating arms 11, 12, and 13 are irradiated with laser light so as to remove a part of each metal film.

The irradiation of laser light is performed from the tip end sides of the first mass portions 51, 52, and 53 opposite to the base portion 15. This is because the weight effect is dominant on the portions of the first mass portions 51, 52, and 53 opposite to the base portion 15, and the frequency of the resonator element 1 can be adjusted in an increasing direction by removing the metal film.

The laser light is continuously irradiated in the X direction so as to cross the vibrating arms 11, 12, and 13. In this way, the metal films are removed in a linear form, and a laser processed line 59 is formed on the first mass portions 51, 52, and 53 for fine tuning. The irradiation of laser light is repeatedly performed and ends when the frequency of the resonator element 1 reaches a target frequency.

Here, although the frequency is adjusted so as to increase by irradiating the first mass portions 51, 52, and 53 with laser light, there is a case where the metal films are removed too much, so that the frequency becomes higher than a target frequency. In that case, portions of the first mass portions 51, 52, and 53 close to the base portion 15 are irradiated with laser light to perform frequency adjustment. This is because the thickness effect is dominant on the portions of the first mass portions 51, 52, and 53 close to the base portion 15, and the frequency of the resonator element 1 can be adjusted in a decreasing direction by removing the metal film.

In this way, since the frequency of the resonator element 1 can be adjusted in a decreasing direction as well as an increasing direction, the frequency can be adjusted with high accuracy.

As another frequency adjustment method, frequency adjustment is performed with the second mass portions 55, 56, and 57 for rough tuning so as to achieve a target frequency, and thereupon, frequency adjustment is performed with the first mass portions 51, 52, and 53 for fine tuning. In the fine tuning, it is determined whether the frequency of the resonator element is higher or lower than the target frequency. If the frequency is lower than the target frequency, the metal films of the first mass portions 51, 52, and 53 on the side opposite to the base portion 15 are removed. If the frequency is higher than the target frequency, the metal films of the first mass portions 51, 52, and 53 close to the base portion 15 are removed. With such a method, the frequency adjustment of the resonator element 1 can be performed.

Although the metal film of the first mass portion was removed in a linear form, the film may be removed in the form of dots with an interval.

Moreover, when the resonator element 1 is mounted on a container, since the frequency changes due to circuit capacitance or the like, it is preferable to perform frequency adjustment after the resonator element 1 is mounted on the container.

As described above, the resonator element 1 of the present embodiment is a resonator element that vibrates in the out-of-plane mode and has a configuration in which the first mass portions 51, 52, and 53 are formed approximately at the centers of the entire length L of the vibrating arms 11, 12, and 13. At the center of the vibrating arms 11, 12, and 13, the boundary of the weight effect where the frequency increases/decreases with an increase/decrease of the mass and the thickness effect where the frequency increases/decreases with the thicknesses of the vibrating arms 11, 12, and 13 is present. For example, at portions where the weight effect is dominant when the metal film or the like is removed, the frequency is adjusted so as to increase. On the other hand, at portions where the thickness effect is dominant when the metal film or the like is removed, the frequency is adjusted so as to decrease.

As described above, it is possible to perform high-accuracy frequency adjustment in which the frequency of the resonator element 1 can be adjusted in the positive (higher) and negative (lower) directions in the intermediate portions of the vibrating arms 11, 12, and 13, and the variation in the frequencies with the removal of the metal film is small.

In addition, since the frequency can be adjusted through the first mass portions 51, 52, and 53 formed on the XY plane of the vibrating arms 11, 12, and 13, it is possible to simplify the frequency adjustment without needing to process the side surfaces of the vibrating arms 11, 12, and 13 as in the related art and to miniaturize the resonator element 1.

Although the first mass portion was formed on the same surface as the surface on which the piezoelectric element of the vibrating arm was formed, the first mass portion may be formed on an opposite surface.

In the present embodiment, although the method of removing the metal film has been described, the frequency adjustment of the resonator element is possible by a method of adding the metal film.

Modifications

Next, modifications of the configuration of the metal film of the first mass portion according to the first embodiment will be described.

Figure 6A:
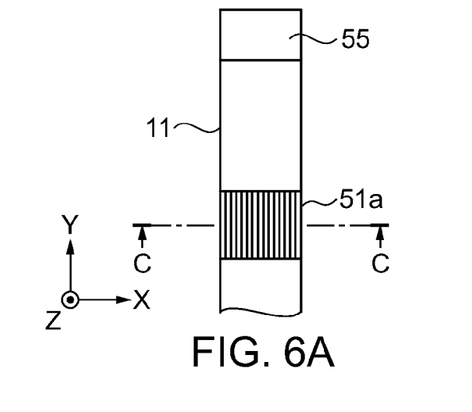
FIGS. 6A to 6F are views showing configurations of the metal film of the first mass portion according to modifications.
Figure 6B:
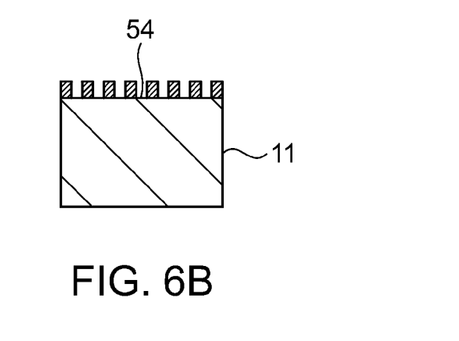
Figure 6C:
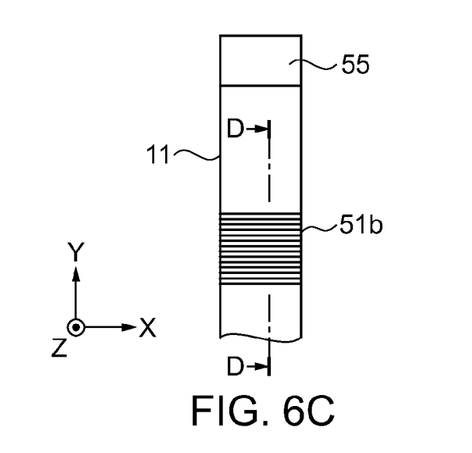
Figure 6D:
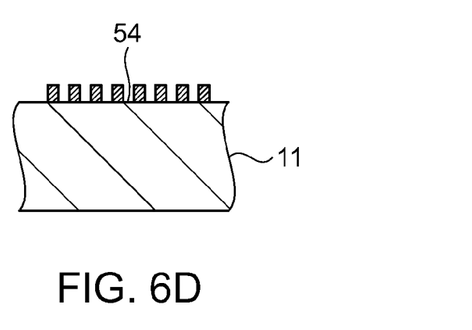
Figure 6E:
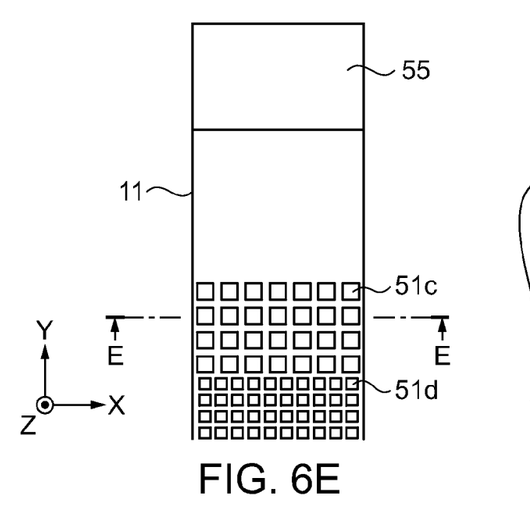
Figure 6F:
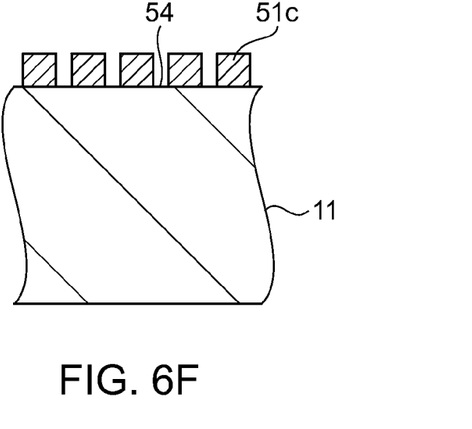

FIGS. 6A to 6F show configurations of the metal film according to modifications of the first mass portion. Specifically, FIG. 6A is a top view showing a first modification, and FIG. 6B is a sectional view taken along the line C-C in FIG. 6A. Moreover, FIG. 6C is a top view showing a second modification, and FIG. 6D is a sectional view taken along the line D-D in FIG. 6C. Furthermore, FIG. 6E is a top view showing a third modification, and FIG. 6F is a sectional view taken along the line E-E in FIG. 6E. Although one vibrating arm is shown in FIGS. 6A to 6F, the other two vibrating arms have the same configuration.

As the first modification, as shown in FIGS. 6A and 6B, a first mass portion 51a is formed in an intermediate portion of the vibrating arm 11, and a number of grooves 54 are formed as slits on the metal film of the first mass portion 51a so as to extend in the extension direction (Y direction) of the vibrating arm 11.

As the second modification, as shown in FIGS. 6C and 6D, a first mass portion 51b is formed in an intermediate portion of the vibrating arm 11, and a number of grooves 54 are formed as slits on the metal film of the first mass portion 51b so as to extend in the width direction (X direction) of the vibrating arm 11.

Since the first mass portion 51a or 51b is formed as slits, the variation in the frequencies is small with respect to the removal of the same area of the metal film, and thus high-accuracy fine tuning is possible.

The formation direction of the slits is not limited to the above, and oblique slits are also possible.

As the third modification, as shown in FIGS. 6E and 6F, first mass portions 51c and 51d may be formed near the center of the vibrating arm 11, and the metal film of the first mass portions 51c and 51d may be formed as a number of blocks arranged in the width direction (X direction) and the length direction (Y direction) of the vibrating arm 11. By forming the first mass portions 51d so as to be smaller than the first mass portions 51c as shown in the drawings, an arbitrary mass portion can be selected in accordance with the amount of frequency adjustment.

Second Embodiment

Next, a resonator having the above-described resonator element will be described as a second embodiment.

Figure 7A:
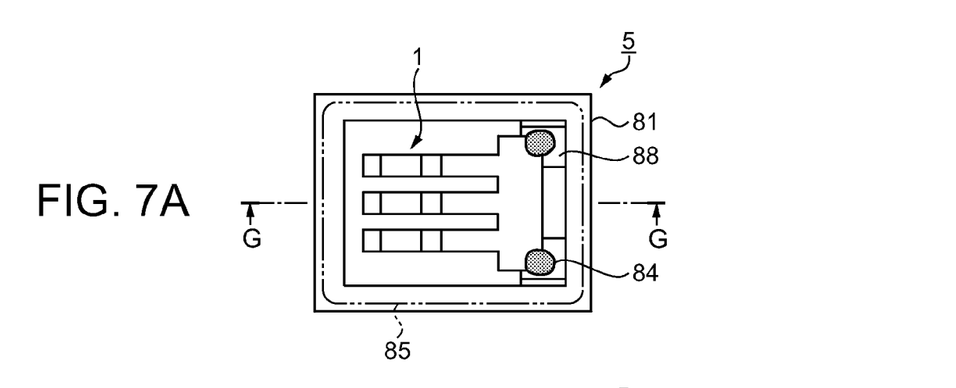
FIG. 7A is a schematic top view.
Figure 7B:
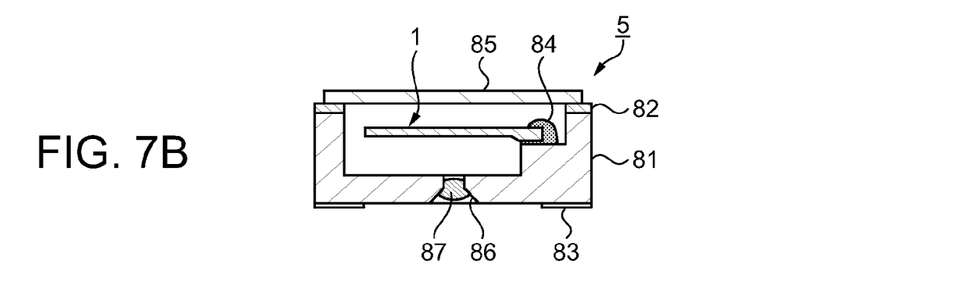
FIG. 7B is a schematic sectional view taken along the line G-G in FIG. 7A.

FIGS. 7A and 7B show a configuration of a resonator, in which FIG. 7A is a schematic top view, and FIG. 7B is a schematic sectional view taken along the line G-G in FIG. 7A.

A resonator 5 includes the resonator element 1 according to the first embodiment, a ceramic package 81 serving as a container, and a cover 85.

The ceramic package 81 has a recess portion which is formed so as to accommodate the resonator element 1, and connection pads 88 connected to the mount electrodes of the resonator element 1 are formed in the recess portion. The connection pads 88 are connected to wirings in the ceramic package 81 so as to be conducted to external connection terminals 83 which are provided on the periphery of the ceramic package 81.

Moreover, a seam ring 82 is provided around the recess portion of the ceramic package 81. Furthermore, a penetration hole 86 is provided on the bottom portion of the ceramic package 81.

The resonator element 1 is attached and fixed to the connection pads 88 of the ceramic package 81 by a conductive adhesive agent 84, and the cover 85 covering the recess portion of the ceramic package 81 is seam-welded to the seam ring 82. The penetration hole 86 of the ceramic package 81 is filled with a metallic sealing material 87. The sealing material 87 is melted in a depressurized atmosphere and is hermetically sealed so that the inside of the ceramic package 81 is in the depressurized state.

Given the above, since the resonator 5 includes the resonator element 1 which enables easy and high-accuracy frequency adjustment, it is possible to provide the resonator 5 having excellent frequency accuracy.

Third Embodiment

Next, an oscillator having the above-described resonator element will be described as a third embodiment.

Figure 8A:
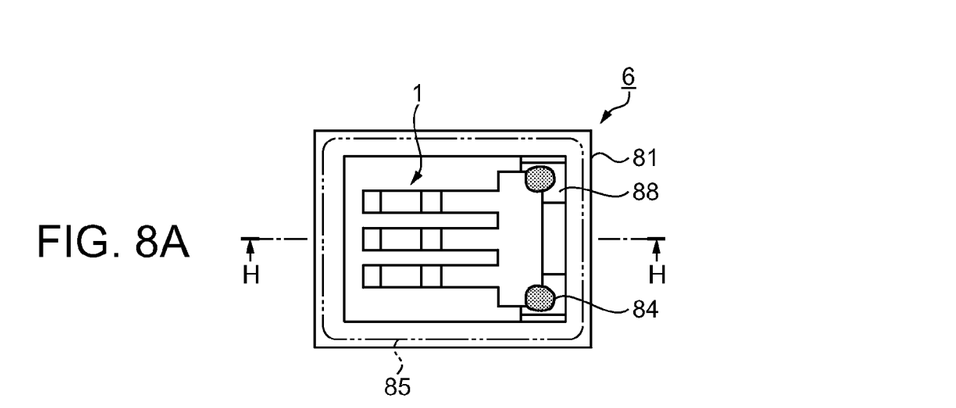
FIG. 8A is a schematic top view.
Figure 8B:
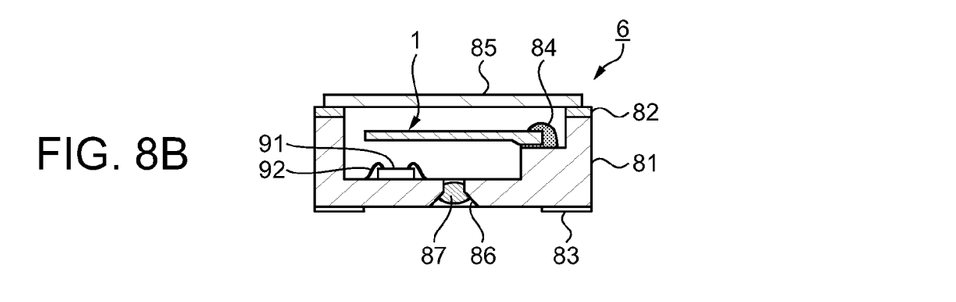
FIG. 8B is a schematic sectional view taken along the line H-H in FIG. 8A.

FIGS. 8A and 8B show a configuration of an oscillator, in which FIG. 8A is a schematic top view, and FIG. 8B is a schematic sectional view taken along the line H-H in FIG. 8A.

An oscillator 6 is different from the resonator 5 described above in that it further includes an IC chip as a circuit element. Therefore, the same constituent elements as those of the resonator 5 will be denoted by the same reference numerals, and description thereof will be omitted.

The oscillator 6 includes the resonator element 1 according to the first embodiment, the ceramic package 81 serving as a container, the cover 85, and an IC chip 91 serving as a circuit element.

The IC chip 91 includes an oscillation circuit that excites the resonator element 1, and is fixed to the bottom portion of the ceramic package 81 and connected to other wirings by metal wires 92 such as gold wires.

Given the above, since the oscillator 6 includes the resonator element 1 which enables easy and high-accuracy frequency adjustment, it is possible to provide the oscillator 6 having excellent frequency accuracy.

Fourth Embodiment

Next, an electronic device using the above-described resonator element will be described as a fourth embodiment. However, the electronic device is not illustrated.

The above-described resonator element 1 can be preferably used, for example, as a reference clock generation source for various electronic devices such as portable telephones, electronic books, personal computers, televisions, digital still cameras, video cameras, video tape recorders, car navigation systems, pagers, electronic organizers, electronic calculators, word processors, workstations, video phones, POS terminals, and apparatuses equipped with touch panels. In any of the cases, an electronic device exhibiting the same advantages as described in the respective embodiments and modifications can be provided.

The entire disclosure of Japanese Patent Application No. 2009-299045, filed Dec. 29, 2009 and No. 2010-180100, filed Aug. 11, 2010 are expressly incorporated by reference herein.

What is claimed is

1. A resonator element comprising:
a base portion provided on a plane including a first axis and a second axis orthogonal to the first axis;
a vibrating arm extending from the base portion in the first axis direction;
a first mass portion for adjusting a resonance frequency of the vibrating arm;
a piezoelectric film; and
first and second electrodes that sandwich the piezoelectric film, the piezoelectric film and the first and second electrodes causing flexural vibration of the vibrating arm,
wherein the vibrating arm performs the flexural vibration in a direction perpendicular to the plane and has a first surface which contracts or expands with the flexural vibration and a second surface which expands when the first surface contracts and contracts when the first surface expands,
wherein the first mass portion, the piezoelectric film and the first and second electrodes are formed only on the first surface of the vibrating arm, the piezoelectric film and the first and second electrodes are formed on an entirety of the first surface between the first mass portion and the base portion, and the first mass portion is provided approximately at the center of the length of the vibrating arm from a base-side end to a tip end thereof, and
a plurality of the vibrating arm on which the first mass portion, the piezoelectric film and the first and second electrode are formed are extend from the base portion in the first axis direction, the plurality equaling one of three and five.

2. The resonator element according to claim 1, wherein the first mass portion is formed from a gold film.

3. The resonator element according to claim 2, wherein slits are provided on the first mass portion.

4. The resonator element according to claim 1, wherein the first mass portion is provided in at least a portion of the range of 0.30 L or more and 0.65 L or lower from a base-side end with respect to an entire length L of the vibrating arm.

5. The resonator element according to claim 1, wherein the first mass portion is provided in at least a portion of the range of 0.42 L or more and 0.57 L or lower from a base-side end with respect to an entire length L of the vibrating arm.

6. The resonator element according to claim 1, further comprising a second mass portion for adjusting the resonance frequency formed only on the first surface of the tip end of the vibrating arm.

7. A frequency adjustment method comprising:
preparing a resonator element including a base portion provided on a plane including a first axis and a second axis orthogonal to the first axis, a vibrating arm extending from the base portion in the first axis direction, a first mass portion for adjusting a resonance frequency of the vibrating arm a piezoelectric film, first and second electrodes that sandwich the piezoelectric film for causing flexural vibration of the vibrating arm, the vibrating arm performing the flexural vibration in a direction perpendicular to the plane and having a first surface which contracts or expands with the flexural vibration and a second surface which expands when the first surface contracts and contracts when the first surface expands, and the first mass portion, the piezoelectric film and the first and second electrodes are formed only on the first surface of the vibrating arm, the piezoelectric film and the first and second electrodes are formed on an entirety of the first surface between the first mass portion and the base portion, and the first mass portion is provided approximately at the center of the length of the vibrating arm from a base-side end to a tip end thereof; and
adjusting the resonance frequency of the vibrating arm by changing the mass of the first mass portion, wherein
a plurality of the vibrating arm on which the first portion, the piezoelectric film and the first and second electrodes are formed extend from the base portion in the first axis direction, the plurality equaling one of three and five.

8. The frequency adjustment method according to claim 7, wherein the frequency of the resonator element is set so as to be lower than a target frequency before the fine-adjusting of the frequency, and the mass is decreased from the first mass portion formed on the tip end side of approximately the center of the length in the first axis direction of the vibrating arm.

9. The frequency adjustment method according to claim 7, wherein the first mass portion is formed from a gold film, and the mass of the first mass portion is decreased by removing the gold film using a laser.

10. A resonator comprising:
the resonator element according to claim 1; and
a package accommodating the resonator element.

11. An oscillator comprising:
the resonator element according to claim 1; and
a circuit element connected to the resonator element.

12. An electronic device using the resonator element according to claim 1.

* * * * *